United States Patent
Lin et al.

(10) Patent No.: US 6,896,975 B2
(45) Date of Patent: May 24, 2005

(54) SPIN-VALVE SENSOR WITH PINNING LAYERS COMPRISING MULTIPLE ANTIFERROMAGNETIC FILMS

(75) Inventors: Tsann Lin, Saratoga, CA (US); Daniele Mauri, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/040,061

(22) Filed: Jan. 4, 2002

(65) Prior Publication Data

US 2003/0128482 A1 Jul. 10, 2003

(51) Int. Cl.[7] ................................ G11B 5/127
(52) U.S. Cl. .................. 428/637; 428/670; 428/678; 428/680; 428/686; 428/215; 428/216; 428/332; 428/336; 428/692; 360/324.11
(58) Field of Search ................. 428/611, 637, 428/670, 678, 680, 686, 215, 216, 332, 336, 692, 614 ML; 360/324.11

(56) References Cited

U.S. PATENT DOCUMENTS

| | | | | |
|---|---|---|---|---|
| 5,919,580 | A | | 7/1999 | Barnard et al. ............ 428/692 |
| 6,493,196 | B1 | * | 12/2002 | Noma et al. ............ 360/324.11 |
| 6,495,275 | B2 | * | 12/2002 | Kamiguchi et al. ......... 428/692 |
| 6,515,838 | B1 | * | 2/2003 | Gill ........................ 360/324.12 |
| 2001/0013997 | A1 | | 8/2001 | Sasaki et al. ................ 360/317 |
| 2002/0024780 | A1 | | 2/2002 | Mao et al. ............. 360/324.11 |

FOREIGN PATENT DOCUMENTS

| | | | |
|---|---|---|---|
| JP | 8-88118 | 4/1996 | ........... H01F/10/14 |
| JP | 9-50612 | 2/1997 | ............ G11B/5/39 |
| JP | 11-26232 | 1/1999 | ........... H01L/10/00 |
| JP | 11-175919 | 7/1999 | ............ G11B/5/39 |
| JP | 11-214767 | 8/1999 | ........... H01L/43/08 |

OTHER PUBLICATIONS

English Translation of JP 11–175919 A (PTO 04–274).*

* cited by examiner

Primary Examiner—Kevin M. Bernatz
(74) Attorney, Agent, or Firm—Kunzler & Associates

(57) ABSTRACT

A spin-valve sensor with pinning layers comprising multiple antiferromagnetic films is disclosed. The multiple antiferromagnetic films are preferably selected from the same Mn-based (Ni—Mn or Pt—Mn) alloy system. The Mn content of the antiferromagnetic film in contact with the reference layer of the spin-valve sensor is selected in order to maximize its exchange coupling to the reference layer, thereby providing a high unidirectional anisotropy field for proper sensor operation. The Mn content of the other antiferromagnetic films not in contact with the reference layer of the spin-valve sensor is reduced in order to maximize the thermal stability and corrosion resistance of the spin-valve sensor for robust sensor operation at high temperatures in disk drive environments.

27 Claims, 7 Drawing Sheets

SPIN-VALVE SENSOR WITH PINNING LAYERS COMPRISING MULTIPLE ANTIFERROMAGNETIC FILMS

BACKGROUND OF THE INVENTION

1. The Field of the Invention

The present invention relates generally to a spin-valve sensor for reading information signals from a magnetic medium and, in particular, to a spin-valve sensor with pinning layers comprising multiple antiferromagnetic films of varying manganese (Mn) concentrations.

2. The Relevant Art

Computer systems generally utilize auxiliary memory storage devices having magnetic media on which data can be written and from which data can be read for later uses. A direct access storage device, such as a disk drive, incorporating rotating magnetic disks is commonly used for storing data in a magnetic form on the disk surfaces. Data are recorded on concentric, radially spaced tracks on the disk surfaces. Magnetic recording heads carrying read sensors are then used to read data from the tracks on the disk surfaces.

In high capacity disk drives, a giant magnetoresistance (GMR) head carrying a spin-valve sensor is now extensively used to read data from the tracks on the disk surfaces. This spin-valve sensor typically comprises two ferromagnetic films separated by an electrically conducting nonmagnetic film. The resistance of this spin-valve sensor varies as a function of the spin-dependent transmission of conduction electrons between the two ferromagnetic films and the accompanying spin-dependent scattering which takes place at interfaces of the ferromagnetic and nonmagnetic films.

In the spin-valve sensor, one of the ferromagnetic films, referred to as a reference (pinned) layer, typically has its magnetization pinned by exchange coupling with an antiferromagnetic film, referred to as a pinning layer. The magnetization of the other ferromagnetic film, referred to as a "sensing" or "free" layer is not fixed, however, and is free to rotate in response to signal fields from a magnetic medium. In the spin-valve sensor, the GMR effect varies as the cosine of the angle between the magnetization of the reference layer and the magnetization of the sensing layer. Recorded data can be read from the magnetic medium because the external magnetic field from the magnetic medium causes a change in the direction of magnetization in the sensing layer, which in turn causes a change in the resistance of the spin-valve sensor and a corresponding change in a sensed voltage FIG. 1 shows a typical prior art spin-valve sensor 100 utilizing the GMR effect. The spin-valve sensor 100 is fabricated in a central region 102 separating two end regions 103 and 105. Various metallic films of the spin-valve sensor are deposited on a bottom gap layer 118, which is previously deposited on a bottom shield layer 120, which is, in turn, deposited on a substrate. Photolithographic patterning and ion milling are applied to define the central region 102 and the two end regions 103 and 105.

A ferromagnetic sensing layer 106 is separated from a ferromagnetic reference layer 110 by an electrically conducting nonmagnetic spacer layer 108. The magnetization of the reference layer 110 is fixed through exchange coupling with an antiferromagnetic pinning layer 112. This spin-valve sensor is deposited on seed layers 104, on which the sensing, spacer, reference and pinning layers of the spin-valve sensor grow with preferred crystalline textures during depositions so that desired improved GMR properties are attained. A cap layer 114 is deposited on the spin-valve sensor for protection in subsequent processes.

Longitudinal bias (LB) and conducting lead layers 126 are deposited in the end regions 103 and 105. All the metallic films deposited in the central and end regions are sandwiched between electrically insulating nonmagnetic films, one referred as a bottom gap layer 118 and the other referred as a top gap layer 124.

The disk drive industry has been engaged in an ongoing effort to fabricate a smaller spin-valve sensor for increasing the recording density of a disk drive, and correspondingly to increase the GMR coefficient of the smaller spin-valve sensor for ensuring high signal sensitivity. A higher GMR coefficients leads to higher signal sensitivity, and thus leads to a feasibility of storing more bits of information in an unit area on a disk surface, i.e., a feasibility of increasing the recording density of the disk drive. The GMR coefficient of the spin-valve sensor is expressed as $\Delta R_G/R_{//}$, where $R_{//}$ is a resistance measured when the magnetizations of the sensing and reference layers are parallel to each other, and $\Delta R_G$ is the maximum giant magnetoresistance (GMR) measured when the magnetizations of the sensing and reference layers are antiparallel to each other.

To ensure proper sensor operation, exchange coupling between the ferromagnetic reference layer and the antiferromagnetic pinning layer must be high enough to rigidly pin the magnetization of the reference layer in a transverse direction perpendicular to an air bearing surface. An inadequate exchange coupling may cause canting of the magnetization of the reference layer from the preferred transverse direction, thus causing malfunction of the spin-valve sensor. This ferromagnetic/antiferromagnetic exchange coupling is typically characterized by a unidirectional anisotropy field ($H_{UA}$) induced from this exchange coupling. This $H_{UA}$ thus must be high enough to rigidly pin the magnetization of the reference layer for proper sensor operation.

A smaller spin-valve sensor operates at higher temperatures in the disk drive. The sensor operation temperature can reach as high as 180° C. and even beyond. To ensure proper sensor operation at such high temperatures in the disk drive, it is very crucial to ensure a high $H_{UA}$ at such high temperatures. This thermal stability is typically described by a blocking temperature ($T_B$), where the ferromagnetic/ anitferromagnetic exchange coupling diminishes and $H_{UA}$ is zero. A higher $T_B$ typically indicates a higher $H_{UA}$ at the sensor operation temperature.

The disk drive industry has thus been engaged in an ongoing effort to increase the $H_{UA}$ and ($T_B$). This effort is typically devoted to the selection of ferromagnetic and antiferromagnetic films from various alloy systems as reference and pinning layers, respectively. Recently, a ferromagnetic film selected from a Co—Fe alloy system has replaced a ferromagnetic film selected from a Ni—Fe alloy system as a reference layer, in order to increase the GMR coefficient, $H_{UA}$ and $T_B$. On the other hand, an antiferromagnetic film selected from a Ni—Mn or Pt—Mn alloy system as a pinning layer has been extensively implemented in the current GMR head fabrication process.

In the selection process of an antiferromagnetic film from a Ni—Mn or Pt—Mn alloy system as a pinning layer, the Mn content of the Ni—Mn or Pt—Mn film must be carefully selected. A small difference in the Mn content leads to substantial variations in both $H_{UA}$ and $T_B$. In addition, since the Mn is the most diffusive and corrosive chemical element among all the chemical elements used in the spin-valve sensor, its content thus substantially determines the corrosion resistance and thermal stability of the spin-valve sensor.

The currently used Mn content of the Ni—Mn or Pt—Mn films is selected only from a small composition range for attaining a high $H_{UA}$. This Mn content may not be low enough to minimize the Mn diffusion, attain a high $T_B$, and ensure high corrosion resistance. Hence, it is difficult, or almost impossible, to find a suitable Mn content for either the Co—Fe/Ni—Mn or Co—Fe/Pt—Mn films to attain a high $H_{UA}$ and a high $T_B$ simultaneously, as well as desirable corrosion resistance.

For example, in the prior art spin-valve sensor with a Ni—Mn pinning layer, a Mn content of more than 57 at % is selected in order to attain a high $H_{UA}$ beyond 600 Oe. However, previous studies indicate that such a high Mn content leads to a low $T_B$ and to a low corrosion resistance. Hence, to operate a smaller sensor robustly at high temperatures for magnetic recording at ever increasing densities, very robust pinning layers must be found.

In previous studies, a spin-valve sensor with pinning layers formed of two antiferromagnetic films selected from two different binary alloy systems, such as Ir—Mn/Ni—Mn, Ir—Mn/Pt—Mn, Pt—Mn/Ni—Mn and Ni—Pt—Mn films, has been explored. The Ir—Mn film has been selected since it does not require annealing for developing exchange coupling with the Co—Fe film, thereby eliminating concerns on the Mn diffusion. The Pt—Mn film is generally preferred to be in contact with the Co—Fe film to minimize the Mn diffusion and to provide a high $H_{UA}$. The Ni—Mn film is preferred not to be in contact with the Co—Fe film, while still providing a high $T_B$. Nevertheless, since the Ir—Mn, Ni—Mn, and Pt—Mn films have different lattice parameters, the lattice mismatch causes exchange decoupling between the two different antiferromagnetic films, leading to difficulties in achieving the desired improvements.

In other previous studies, a spin-valve sensor with a pinning layer formed of an antiferromagnetic film selected from a ternary alloy system, such as Ni—Pt—Mn, Ni—Ir—Mn, Pt—Ir—Mn, etc., has also been explored. However, its antiferromagnetism has been found to be very weak, probably due to incompatibility of Ni, Pt, and Ir elements.

From the above discussion, it can be seen that it would be beneficial to further improve current spin-valve sensors through the discovery of more robust pinning layers that facilitate magnetic recording at increased densities.

OBJECTS AND BRIEF SUMMARY OF THE INVENTION

The apparatus of the present invention has been developed in response to the present state of the art, and in particular, in response to the problems and needs in the art that have not yet been fully solved by currently available spin-valve sensors. Accordingly, it is an overall object of the present invention to provide an improved spin-valve sensor that overcomes many or all of the above-discussed shortcomings in the art.

To achieve the foregoing object, and in accordance with the invention as embodied and broadly described herein in the preferred embodiments, an improved spin-valve sensor is provided. The spin-valve sensor in one embodiment comprises a seed layer, a sensing layer, a spacer layer, a reference layer, a plurality of pinning layers and a cap layer, as discussed above. In one embodiment the spin-valve sensor of the present invention comprises two antiferromagnetic films as pinning layers for the spin-valve sensor. The two antiferromagnetic films are preferably selected from a Ni—Mn or Pt—Mn alloy system. The reference layer may in one embodiment be formed of a Co or Co—Fe film.

In one embodiment, the pinning layers comprise a first AFM film that is disposed closer to the reference layer and that has a higher Mn content than a second AFM film which is disposed further from the reference layer. The pinning layers are configured in this manner to minimize reference layer rotation during sensor operation at high temperatures.

The spin-valve sensor of the present invention may be incorporated within a disk drive system comprising a magnetic recording disk; a spin-valve sensor configured in the manner discussed above; an actuator for moving the spin-valve sensor across the magnetic disk; and a detector. The spin-valve sensor accesses different regions of magnetically recorded data on the magnetic disk. The detector may be electrically coupled to the spin-valve sensor for detecting changes in resistance of the sensor caused by rotation of the magnetization of the free ferromagnetic layer relative to the fixed magnetization of the reference layer in response to magnetic fields from the recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
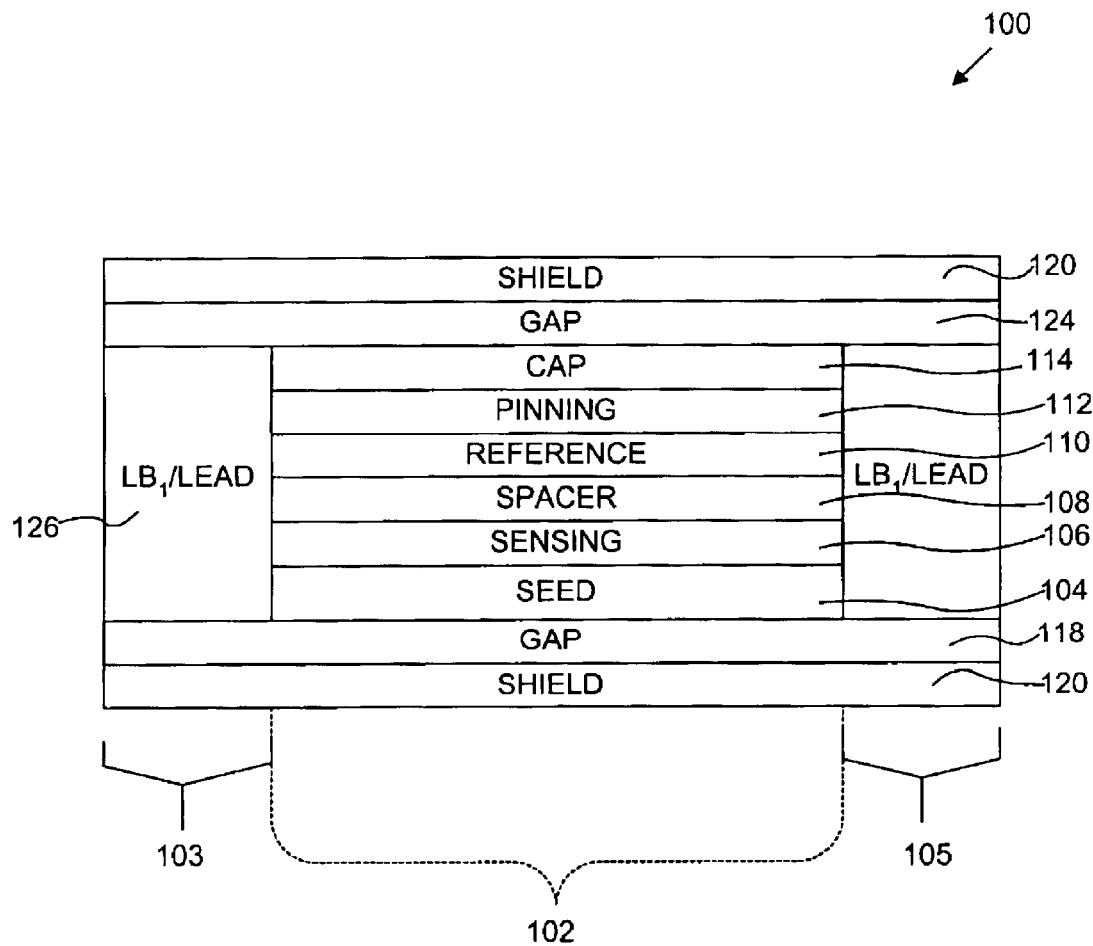
FIG. 1 is a cross-sectional view illustrating the structure of a spin-valve sensor of the prior art.
Figure 2:
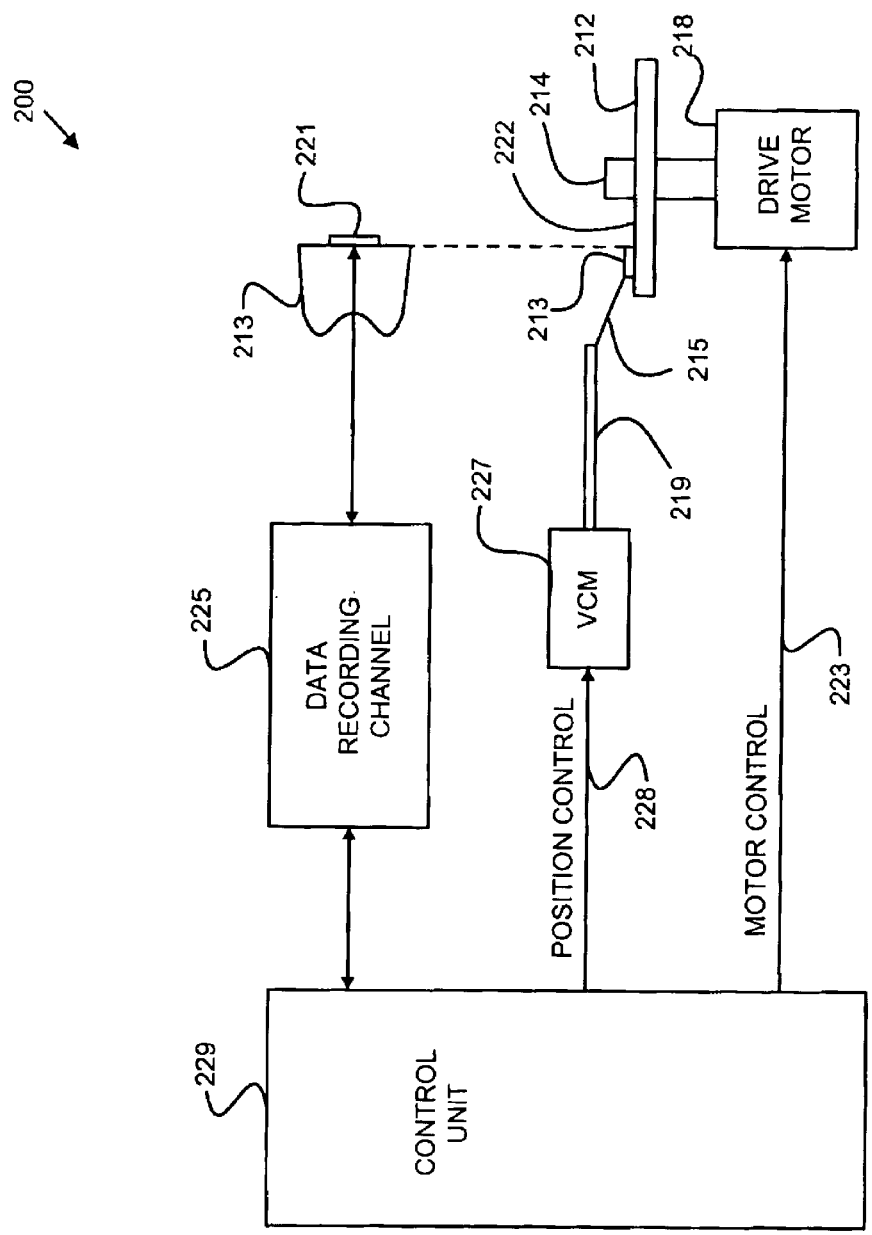
FIG. 2 is a schematic block diagram illustrating a magnetic recording disk drive system.

FIG. 2 schematically depicts one example of a disk drive 200 suitable for incorporating a spin-valve sensor of the present invention. As shown in FIG. 2, the disk drive 200 comprises at least one rotatable magnetic disk 212 supported on a spindle 214 and rotated by a disk drive motor 218. The magnetic media on each magnetic disk 212 is in the form of concentric, annular data tracks (not shown).

At least one slider 213 is positioned on the magnetic disk 212. Each slider 213 supports one or more magnetic read/write heads 221 incorporating the spin-valve sensor of the present invention. As the magnetic disk 212 rotates, the slider 213 moves back and forth across the disk surface 222 so that the heads 221 may access different portions of the magnetic disk 212 where desired data are written. Each slider 213 is attached to an actuator arm 219 by means of a suspension 215. The suspension 215 provides a slight spring force which biases the slider 213 against the magnetic disk surface 222. Each actuator arm 219 is attached to an actuator 227.

The actuator 227 as shown in FIG. 2 may be a voice coil motor (VCM). The VCM comprises a coil movable within a fixed magnetic field, and the direction and speed of the coil movements are controlled by the motor current signals supplied by a controller 229.

During operation of the disk drive system, the rotation of the magnetic disk 212 generates an air bearing between the slider 213 and the disk surface 222 that exerts an upward force or lift on the slider 213. The air bearing thus counterbalances the slight spring force of the suspension 215 and supports the slider 213 off and slightly above the disk surface by a small, substantially constant spacing during normal operation. The surface of the slider 213, which includes the surface of the head 221 and faces the surface of the disk 212, is referred to as an air bearing surface (ABS).

The various components of the disk drive system are controlled in operation by control signals generated by the control unit 229. The control signals include access control signals and internal clock signals. Typically, the control unit 229 comprises logic control circuits, storage means, and a microprocessor. The control unit 229 generates control signals to control various system operations such as drive motor control signals on a line 223 and head position and seek control signals on a line 228. The control signals on the line 228 provide the desired current profiles to optimally move and position the slider 213 to the desired data track on the magnetic disk 212. Read and write signals are communicated to and from the read/write heads 221 by means of a recording channel 225. In the depicted embodiment, the read/write heads 221 incorporate a spin-valve sensor of the present invention.

Figure 3:
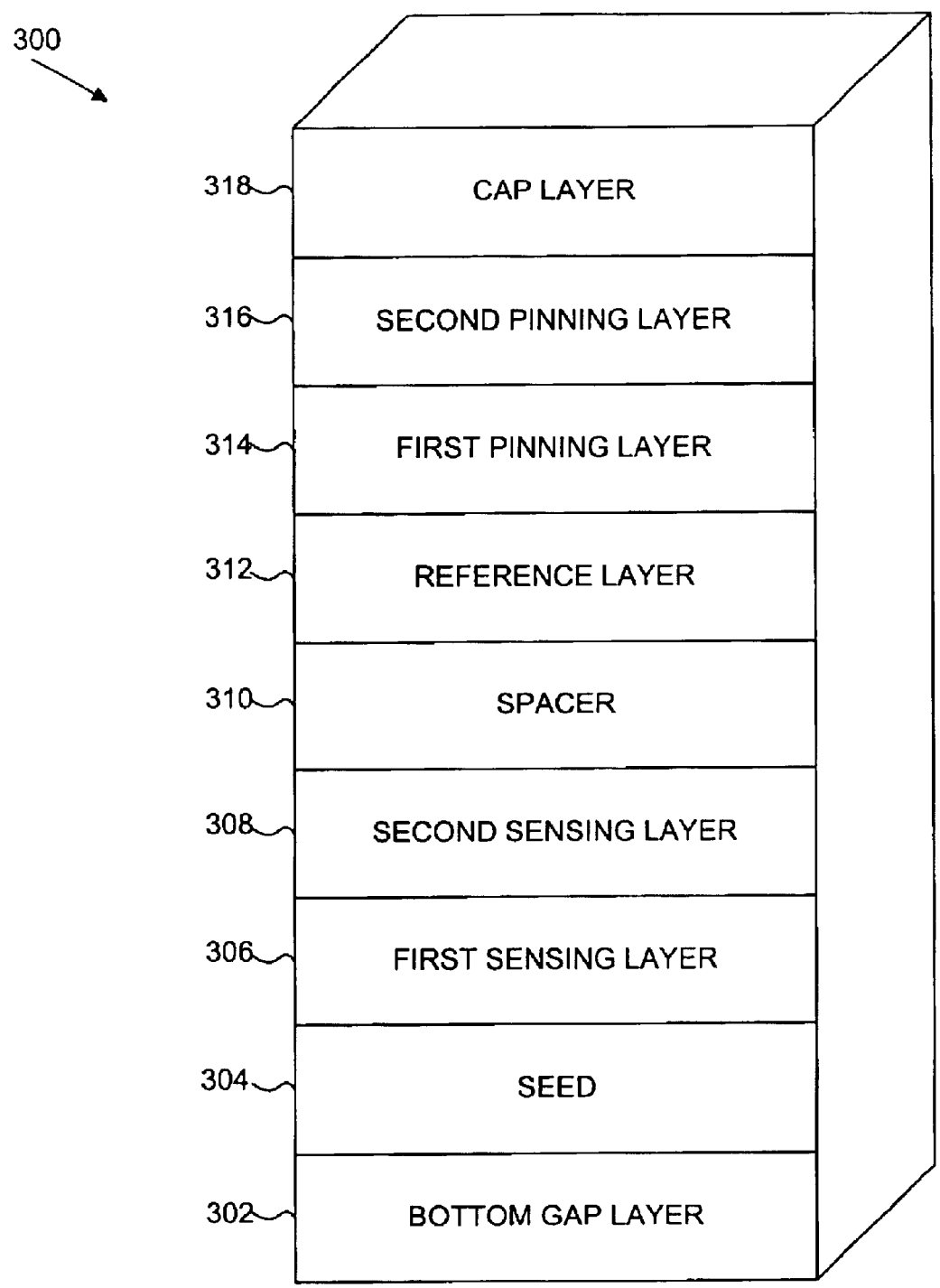
FIG. 3 is a schematic block diagram illustrating one embodiment of a spin-valve sensor of the present invention incorporating pinning layers formed of two antiferromagnetic films.

FIG. 3 illustrates the preferred embodiment of a top-type spin-valve sensor 300 embodying the present invention. As shown in FIG. 3, the spin-valve sensor 300 comprises a bottom gap layer 302, a seed layer 304, a first sensing layer 306, a second sensing layer 308, a spacer layer 310, a reference layer 312, a first pinning layer 314, a second pinning layer 316, and a cap layer 318.

The spin-valve sensor 300 of FIG. 3 is built upon a bottom gap layer 302, which is previously deposited on a bottom shield layer (not shown), which is in turn previously deposited on a wafer (not shown). In the following description, the term "above" is intended to refer to a direction further from the bottom gap layer 302, and the term "below" is intended to refer to a direction closer to the bottom gap layer 302. Likewise, the "bottom" layers are those closest to the bottom gap layer 302, while the "top" layers are those furthest from the bottom gap layer 302.

A seed layer 304 is preferably deposited on the bottom gap layer 302. The seed layer 304 may be configured in a number of different manners in accordance with the invention. The primary function of the seed layer 304 is to form a foundation for the growth of the layers on top of it.

In the depicted embodiment, the first sensing layer 306 is formed of a Ni—Fe film deposited over the seed layer 304. Preferably, the first sensing layer 306 has a thickness in the range from between about 15 and about 60 Å, with a more preferred thickness of about 45 Å. The first sensing layer has an Fe content preferably in the range of between about 12 and about 20 at %, with a more preferred Fe content of about 14 at %.

In the depicted embodiment, the second sensing layer 308 is formed of a Co—Fe film deposited over the first sensing layer 306. In order to obtain a high GMR coefficient, the Co—Fe film is needed for the use as the second sensing layer. The second sensing layer 308 preferably has a thickness in the range of between about 6 and about 27 Å, with a more preferred thickness of about 9 Å. The second sensing layer has an Fe content preferably in a range of between about 5 and about 20 at %, with a more preferred Fe content of about 10 at %.

The spin-valve sensor 300 as depicted in FIG. 3 also includes the spacer layer 310 that is deposited over the second sensing layer 308. The spacer layer 310 is preferably formed of a Cu film. The thickness of the spacer layer 310 is preferably in the range of between about 20 and about 30 Å, with a more preferred thickness of about 24 Å.

The reference layer 312 is deposited over the spacer layer 310. In the depicted embodiment, the reference layer 312 is formed of a Co or Co—Fe film. The reference layer 312 preferably has a thickness in the range of between about 16 and about 40 Å, with a more preferred thickness of about 32 Å.

The first pinning layer 314 is preferably formed of an antiferromagnetic film deposited over the reference layer 312. The second pinning layer 316 is formed of another antiferromagnetic film deposited over the first pinning layer 314. In an alternative embodiment, a plurality of pinning layers formed of a plurality of antiferromagnetic films is deposited over the reference layer 312. The first and second pinning layers comprise Mn-based (Ni—Mn or Pt—Mn) films. The use of a plurality of different types of Mn-based films is contemplated within the present invention and will be described with reference to FIGS. 4, 5, and 6.

The cap layer 318 is deposited over the second pinning layer 316 to protect the deposited metallic films against oxidation. The cap layer 318 is preferably formed of a tantalum (Ta) film. The thickness of the cap layer 318 is preferably in the range of between about 45 Å and about 75 Å, with a more preferred thickness of about 60 Å.

To ensure robust sensor operation at high temperatures in drive environments, the Mn contents of the first and second pinning layers are determined based on certain selected criteria. The first pinning layer contacts with the reference layer, and thus plays a major role in proving a high $H_{UA}$ through an interface effect. The Mn content of the first pinning layer is thus determined based on a criterion of maximizing $H_{UA}$ while maintaining a reasonable high $T_B$ and reasonably high corrosion resistance. The second pinning layer does not contact with the reference layer, and thus plays a very minor role in proving a high $H_{UA}$. However, it can play a more important role in proving a high $T_B$ and high corrosion resistance through volume effect. The Mn content of the second pinning layer is thus determined based on a criterion of maximizing $T_B$ and corrosion resistance while still maintaining a reasonable high $H_{UA}$.

Figure 4:
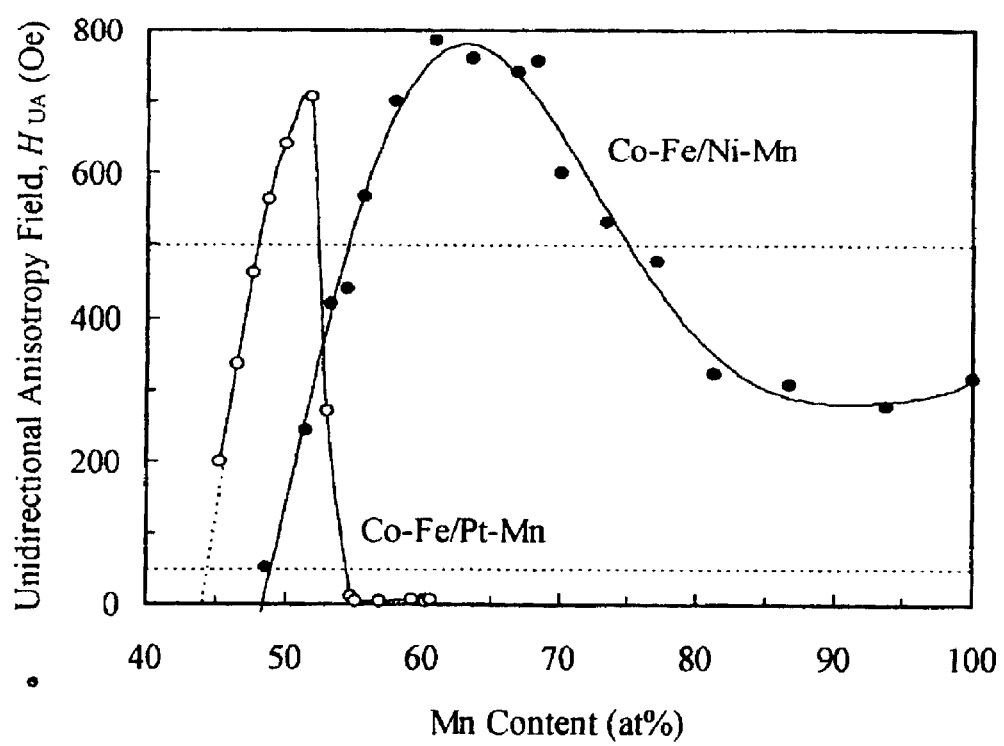
FIG. 4 is a chart showing the unidirectional anisotropy field ($H_{UA}$) versus the Mn content for Co—Fe/Ni—Mn and Co—Fe/Pt—Mn films.

In order to properly apply these two criteria, the Mn content effects on the $H_{UA}$, $T_B$ and corrosion resistance has be studied in the development of the present invention. FIG. 4 shows $H_{UA}$ versus the Mn content for the Co—Fe(32)/Ni—Mn(250) and Co—Fe(32)/Pt—Mn(200) films (thickness in Å) after annealing for 4 and 2 hours, respectively, at 280° C. A Mn content of 50 at % is originally considered to be preferred to attain desired antiferromagnetic $Ni_{50}Mn_{50}$ and $Pt_{50}Mn_{50}$ phases.

Experimentally, the $H_{UA}$ reaches peak values of 785 and 707 Oe when the Mn contents of the Ni—Mn and Pt—Mn films are 60.8 and 51.8 at %, respectively. The $H_{UA}$ exceeds 500 Oe when the Mn contents of the Ni—Mn and Pt—Mn films range from 54.2 to 75.1 at % and from 47.4 to 52.7 at %, respectively. These composition ranges can be considered suitable for the Mn content of the first pinning layer. In addition, the $H_{UA}$ exceeds 50 Oe when the Mn contents of the Ni—Mn and Pt—Mn films range from 48.6 to 100 at % and from 43.7 to 54.8 at %, respectively. These composition ranges can be considered suitable for the Mn content of the second pinning layer.

Figure 5:
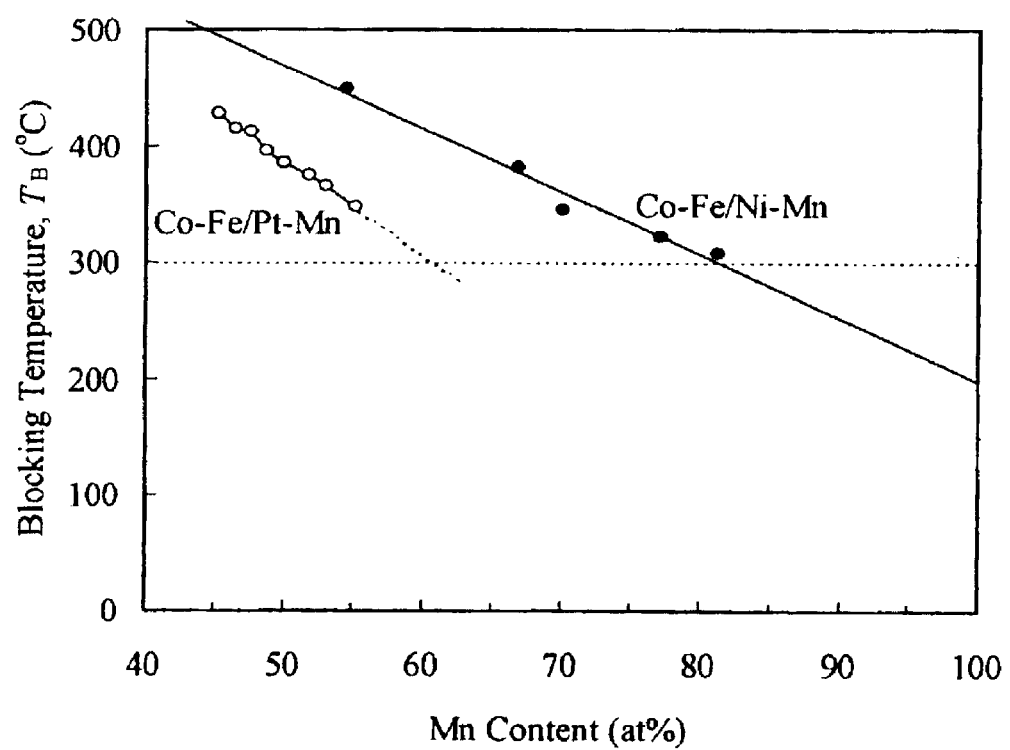
FIG. 5 is a chart showing the blocking temperature ($T_B$) versus the Mn content for Co—Fe/Ni—Mn and Co—Fe/Pt—Mn films.

FIG. 5 shows $T_B$ versus the Mn content for the Co—Fe (32)/Ni—Mn(250) and Co—Fe(32)/Pt—Mn(200) films after annealing for 4 and 2 hours, respectively, at 280° C. The $T_B$ exceeds 300° C. when the Mn contents of the Ni—Mn and Pt—Mn films are lower than 80.9 and 61.7 at %, respectively. Excessive Mn elements have been found to diffuse into the Co—Fe film at high temperatures, causing a loss in the Co—Fe magnetic moment and a decrease in $T_B$. For example, when the Mn contents of the Ni—Mn films are 60 and 80 at %, this loss in the Co—Fe magnetic moment can be as high as 11.8% and 60% of the original Co—Fe magnetic moment, respectively. The Mn content thus must be as low as possible in order to minimize the Mn diffusion and attain a high $T_B$, thereby ensuring good thermal stability.

FIG. 5 shows a corrosion current density ($i_C$) measured in a 0.1 N sodium sulfate electrolyte verses the Mn content for ~100 nm thick Ni—Mn and Pt—Mn films. The $i_c$ is lower than 1 μA/cm² when the Mn content of the Ni—Mn film is lower than 63.2 at %. The Mn content thus should be lower than 63.2 at % in order to prevent corrosion in drive environments.

Figure 6:
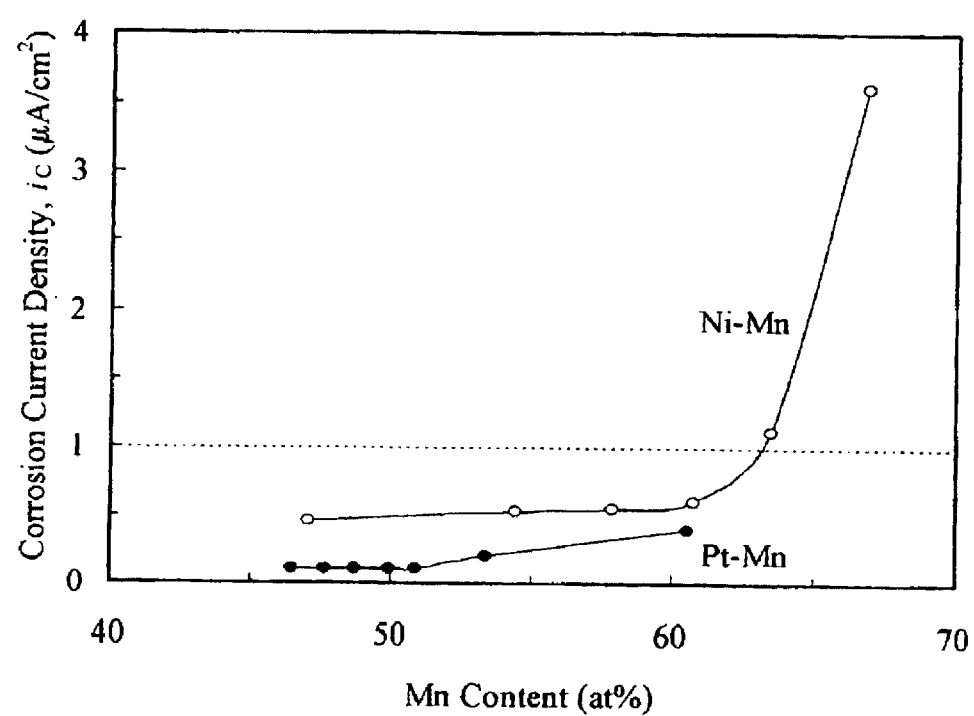
FIG. 6 is a chart showing the corrosion current ($i_C$) versus the Mn content for Ni—Mn and Pt—Mn films.

Based on these studies, the two criteria are applied to the spin-valve sensor with Ni—Mn pinning layers. The first pinning layer is expected to exhibit an $H_{UA}$ exceeding 500 Oe, reasonably high $T_B$ and high corrosion resistance. Referring to FIGS. 4, 5 and 6, the Mn content of the first pinning layer 314 is preferably in the range of between about 54% and about 60%, with a more preferred Mn content of about 57%.

The second pinning layer is expected to exhibit an $H_{UA}$ exceeding 50 Oe, a higher $T_B$ and higher corrosion resistance. A non-zero $H_{UA}$ is needed to ensure the antiferromagnetism of the second pinning layer, thereby ensuring antiferromagnetic/antiferromagnetic exchange coupling between the first and second pinning layers films. With reference to FIGS. 4, 5 and 6, it should be apparent that a beneficial Mn content of the second pinning layer 316 is in a range of between about 49 and about 54 at %, with a more preferred Mn content of about 50 at %.

The total thickness of the first and second pinning layers is preferably at least 200 Å in order to ensure strong exchange coupling with the reference layer. Hence, the first and second pinning layers preferably have a total thickness in the range of between 200 and 300 Å, and more preferably have a total thickness of about 250 Å. The first pinning layer 314 preferably has a thickness in a range of between about 25 and about 225 Å, and has a more preferred thickness of about 125 Å. The second pinning layer 316 has a thickness preferably in a range of between about 25 and about 225 Å, with a more preferred thickness of about 125 Å.

In a first embodiment, the first pinning layer is formed of a 125 Å thick 43Ni-57Mn film, and the second pinning layer is formed of a 125 Å thick 50Ni-50Mn film. These first and second pinning layers have the most preferred Mn contents, as determined from FIGS. 4, 5, and 6.

Table 1 lists $H_{UA}$ and $T_B$ of Co—Fe(32)/43Ni-57Mn (250), Co—Fe(32)/50Ni-50Mn(250) and Co—Fe(32)/43Ni-57Mn(125)/50Ni-50Mn(125) films after annealing for 4 hours at 280° C. As shown in this table, Co—Fe/43Ni-57Mn films exhibits an $H_{UA}$ much higher, but a $T_B$ lower than Co—Fe/50Ni-50Mn films. When the 43Ni-57Mn film is used as the first pinning layer to contribute its higher $H_{UA}$ through an interface effect and the 50Ni-50Mn film is used as the second pinning layer to contribute its higher $T_B$ through a volume effect, the pinning layers are expected to be improved. Indeed, as shown in this table, the Co—Fe/43Ni-57Mn/50Ni-50Mn films exhibit an $H_{UA}$ closer to that of the Co—Fe/43Ni-57Mn films, and a $T_B$ closer to that of the Co—Fe/50Ni-50Mn films.

TABLE 1

$H_{UA}$ and $T_B$ of Co—Fe(32)/43Ni—57Mn(250), Co—Fe(32)/50Ni—50Mn(250) and Co—Fe(32)/43Ni—57Mn(125)/50Ni—50Mn(125) films.

| Films | Co—Fe/43Ni—57Mn | Co—Fe/50Ni—50Mn | Co—Fe/43Ni—57Mn/50Ni—50Mn |
|---|---|---|---|
| $H_{UA}$(Oe) | 733 | 50 | 543 |
| $T_B$(C) | 424 | 466 | 410 |

To attain these improvements, one example of a spin-valve sensor comprising NiO(300)/NiMnO$_x$(30)/Cu(8)/Ni—Fe(45)/Co—Fe(6)/Cu(24)/Co(32)/43Ni-57Mn(125)/50Ni-50Mn(125)/Ta(60) films has fabricated using an integrated DC magnetron/ion beam sputtering system. A Co film, rather than a Co—Fe film, is selected for the use as the reference layer of the spin-valve sensor in order to ensure robust thermal stability. This selection is based on a study that the ferromagnetic coupling field of the spin-valve sensor with the Co reference layer remains about −5 Oe after annealing for 10 hours at 280° C., while that of the spin-valve sensor with the Co—Fe reference layer increases to beyond 30 Oe after annealing for 4 hours at 280° C.

The NiO and NiMnO$_x$ films are deposited preferably with reactive DC-pulsed magnetron sputtering. The Cu/Ni—Fe/Co—Fe films are sequentially deposited preferably with ion beam sputtering. The Cu/Co/43Ni-57Mn/50Ni-50Mn/Ta films are then sequentially deposited preferably with DC magnetron sputtering. The 43Ni-57Mn film is deposited in an argon gas of 3 mTorr from a 40Ni-60Mn target, and the 50Ni-50Mn film is deposited in an argon gas of 3 mTorr from avanessa 47Ni-53Mn target. The Mn content in the Ni—Mn film is slightly lower by up to 3% than that in the Ni—Mn target due to slightly different sizes of Ni and Mn atoms.

The major merit of the use of the first and second pinning layers for the Ni—Mn spin-valve sensor can be further realized by investigating the behaviors of the first and second pinning layers during sensor operation in a disk drive where strong demagnetizing fields perpendicular to the easy axis of the reference layer exist at lower and upper sensor edges at high sensor temperature. To simulate this drive environment and make it more severe, the spin-valve sensor with the Ni—Mn films is annealed in a field of 3 kOe perpendicular to the easy axis of its Co reference layer at 180° C. in a tube oven. After cooling to 30° C. in the field, the magnetization of the reference layer is rotated by an angle ($\theta_2$). This $\theta_2$ is determined from the asymmetry of hard-axis magnetoresistance responses.

Figure 7:
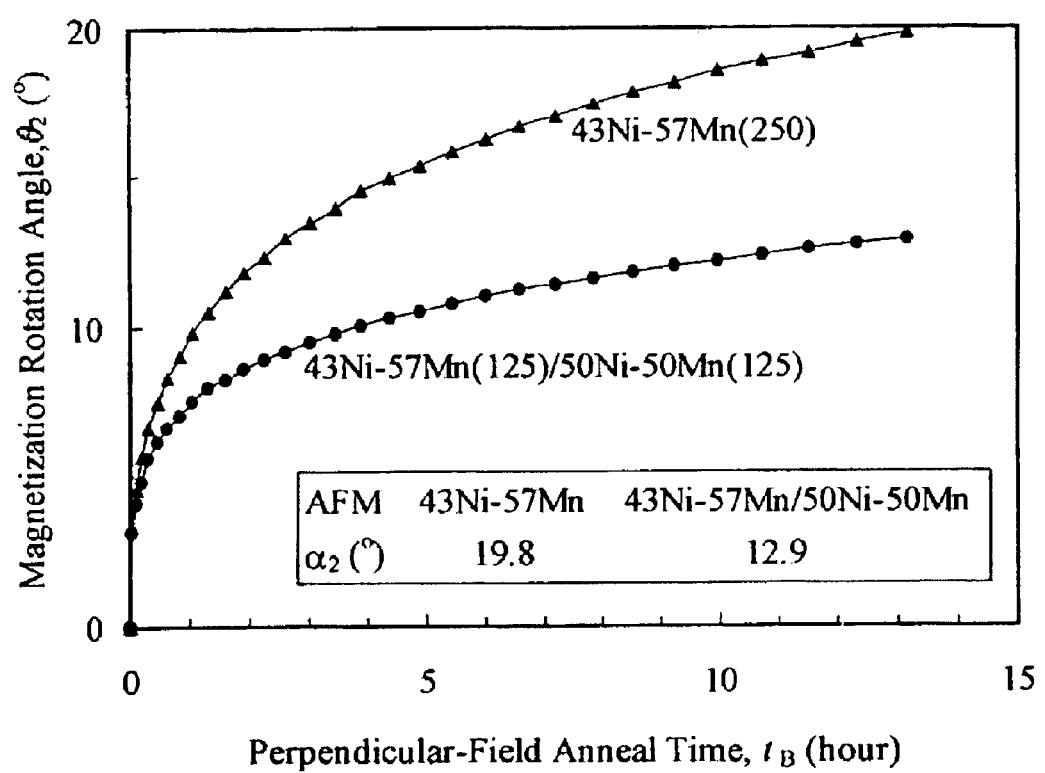
FIG. 7 is a chart showing the magnetization rotation angle of the reference layer versus the anneal time after perpendicular-field anneal at 180° C. for spin-valve sensors with 43Ni-57Mn(250) and 43Ni-57Mn(125)/50Ni-50Mn(125) pinning layers.

FIG. 7 shows the magnetization rotation angle of the reference layer ($\theta_2$) verses anneal time ($t_B$) after perpendicular-field anneal at 180° C. for a spin-valve sensor comprising a 43Ni-57Mn (250) pinning layer and a spin-valve sensor with the 43Ni-57Mn(125)/50Ni-50Mn(125) pinning layers, respectively. After the perpendicular-field anneal is conducted for 12.9 hours, the magnetization of the Co reference layer of the spin-valve sensor with the 43Ni-57Mn pinning layer rotates by about 20 degrees, while the magnetization of the Co reference layer of the spin-valve sensor with the 43Ni-57Mn/50Ni-50Mn pinning layers rotates by only about 13 degrees. This minimal magnetization rotation angle ($\alpha_2$, used as a figure of merit to characterize the thermal stability) indicates improved thermal stability of the spin-valve sensor with the Ni—Mn films. In addition, as shown in FIG. 6, the 50Ni-50Mn film exhibits corrosion resistance higher than the 43Ni-57Mn film. A spin-valve sensor configured in this manner is thus expected to exhibit improved corrosion resistance.

The thermal stability and corrosion resistance of the spin-valve sensor may be further improved by further reducing the Mn content of the second pinning layer, maximizing the thickness of the second pinning layer, and minimizing the thickness of the first pinning layer. However, the Mn content of the second pinning layer should not be too low in order to ensure its antiferromagnetism for needed antiferromagnetic/antiferromagnetic coupling between the first and second pinning layers. In addition, the total thickness of the first and second pinning layers should not be too small in order to ensure needed ferromagnetic/antiferromagnetic coupling between the reference layer and the pinning layers.

In a further embodiment, the two criteria are also applied to the spin-valve sensor with the Pt—Mn pinning layers. The Mn content of the first pinning layer is determined to preferably range from about 47 to about 53 at %, and the more preferred Mn content is determined to be about 52 at %. The Mn content of the second pinning layer is determined to preferably range from about 44 to 47 at %, and the more preferred Mn content is determined to be 45 at %.

In this embodiment, the first pinning layer is formed of a 100 Å thick 48Pt-52Mn film, and the second pinning layer is formed of a 100 Å thick 55Pt-45Mn film. These first and second pinning layers have selected Mn contents determined from the experiments documented in FIGS. 4, 5, and 6. Table 2 lists $H_{UA}$ and $T_B$ of Co—Fe(32)/48Pt-52Mn(200), Co—Fe(32)/55Pt-45Mn(200) and Co—Fe(32)/48Pt-52Mn (100)/55Pt-45Mn(100) films after annealing for 2 hours at 280° C. As shown in this table, Co—Fe/48Pt-52Mn films exhibit an $H_{UA}$ much higher, but a $T_B$ lower than Co—Fe/55Pt-45Mn films. When the 48Pt-52Mn film is used as the first pinning layer to contribute its higher $H_{UA}$ through an interface effect and the 55Pt-45Mn film is used as the second pinning layer to contribute its higher $T_B$ through a volume effect, the pinning layers are expected to be improved. Indeed, as shown in table 2, the Co—Fe/48Pt-52Mn/55Pt-45Mn films exhibit an $H_{UA}$ closer to that of the Co—Fe/48Pt-52Mn films, and a $T_B$ closer to that of the Co—Fe/55Pt-45Mn films.

TABLE 2

$H_{UA}$ and $T_B$ of Co—Fe(32)/48Pt—52Mn(200), Co—Fe(32)/55Pt—45Mn(200) and Co—Fe(32)/48Pt—52Mn(100)/55Pt—45Mn(100) films.

| Films | Co—Fe/48Pt—52Mn | Co—Fe/55Pt—45Mn | Co—Fe/48Pt—52Mn/55Pt—45Mn |
|---|---|---|---|
| $H_{UA}$(Oe) | 707 | 198 | 523 |
| $T_B$(C) | 375 | 428 | 400 |

The total thickness of the first and second layers is preferably at least 150 Å in order to ensure strong exchange coupling with the reference layer. Hence, the first and second pinning layers preferably have a total thickness in the range of between 150 and 250 Å, and have a more preferable total thickness of about 200 Å. The first pinning layer 314 preferably has a thickness in the range of between about 25 and about 175 Å, and has a more preferred thickness of about 100 Å. The second pinning layer 316 has a thickness preferably in the range of between about 25 and about 175 Å, with a more preferable thickness of about 100 Å.

To attain these improvements, in one example, a spin-valve sensor comprising $Al_2O_3$(30)/Ni—Cr—Fe(30)/Ni—Fe(45)/Co—Fe(6)/Cu(24)/Co(32)/48Pt-52Mn(100)/55Pt-45Mn(100)/Ta(60) films is deposited in an integrated DC magnetron/ion beam sputtering system. A Co film, instead of a Co—Fe film, is selected for the use as the reference layer of the spin-valve sensor, in order to ensure robust thermal stability. The $Al_2O_3$ film is deposited preferably with reactive DC-pulsed magnetron sputtering. The Ni—Cr—Fe/Ni—Fe/Co—Fe films are sequentially deposited preferably with ion beam sputtering. The Cu/Co/48Pt-52Mn/55Pt-45Mn/Ta films are then sequentially deposited preferably with DC magnetron sputtering.

The 48Pt-52Mn film is deposited in an argon gas of 4 mTorr from a 40Pt-60Mn target, and the 55Pt-45Mn film is deposited in an argon gas of 2 mTorr from a 45Pt-55Mn target. The Mn content in the Pt—Mn film is reduced by up to 10% relative to that in the Pt—Mn target due to substantially different sizes of Pt and Mn atoms. Alternatively, the two Pt—Mn films may be deposited in very different argon pressures from only one Pt—Mn target. For example, the 48Pt-52Mn and 55Pt-45Mn films may be deposited in argon pressures of 8 and 2 mTorr, respectively, from the 45Pt-55Mn target. In a further alternative, a plurality of Pt—Mn films may be deposited in a plurality of argon pressures from only one Pt—Mn target.

The present invention may also be applied to bottom and dual types of spin-valve sensors, as well as top, bottom and dual types of magnetic-tunnel-junction sensors. When so doing, it is preferred that the Mn content of the pinning layer not in contact with the reference layer be lower than that of the pinning layer that is in contact with the reference layer.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spin-valve sensor, comprising:
   a sensing layer formed of a first ferromagnetic material;
   a reference layer formed of a second ferromagnetic material;
   a spacer layer interposed between the sensing layer and the reference layer, the spacer layer formed of a non-ferromagnetic conducting material;
   a pinning layer disposed adjacent to the reference layer, the pinning layer having a thickness of at least about 200 Å and comprising at least two antiferromagnetic (AFM) binary Ni—Mn films each having a Mn content in the range of about 40 at % and 60 at %.

2. The spin-valve sensor of claim 1, wherein the at least two AFM films comprise a first AFM film in contact with the reference layer and a second AFM film not in contact with the reference layer.

3. The spin-valve sensor of claim 2, wherein the first AFM film has a higher Mn content than the second AFM film.

4. The spin-valve sensor of claim 2, wherein the first AFM Ni—Mn film has a Mn content in the range of between about 54 and about 60 at %.

5. The spin-valve sensor of claim 2, wherein the first AFM Ni—Mn film has a Mn content of about 57 at %.

6. The spin-valve sensor of claim 2, wherein the second AFM film has a Mn content in a range of between about 49 and about 54 at %.

7. The spin-valve sensor of claim 2, wherein the second AFM film has a Mn content of about 50 at %.

8. The spin-valve sensor of claim 2, wherein the first AFM Ni—Mn film has a thickness in a range between about 25 and about 225 Å.

9. The spin valve sensor of claim 2, wherein the first AFM Ni—Mn film has a thickness of about 125 Å.

10. The spin-valve sensor of claim 2, wherein the second AFM Ni—Mn film has a thickness in the range of between about 25 and about 225 Å.

11. The spin-valve sensor of claim 2, wherein the second AFM Ni—Mn film has a thickness of about 125 Å.

12. The spin-valve sensor of claim 2, wherein the first and second AFM Ni—Mn films have a total thickness in a range between about 200 and about 300 Å.

13. The spin-valve sensor of claim 2, wherein the first and second AFM Ni—Mn films have a total thickness of about 250 Å.

14. A spin-valve sensor, comprising:
    a sensing layer formed of a first ferromagnetic material;
    a reference layer formed of a second ferromagnetic material;
    a spacer layer interposed between the sensing layer and the reference layer, the spacer layer formed of a non-ferromagnetic conducting material;
    a pinning layer disposed adjacent to the reference layer, the pinning layer having a thickness of at least about 200 Å and comprising at least two antiferromagnetic (AFM) binary Pt—Mn films each having a Mn content in the range of about 40 at % and 60 at %.

15. The spin-valve sensor of claim 14, wherein the at least two AFM films comprise a first AFM film in contact with the reference layer and a second AFM film not in contact with the reference layer.

16. The spin-valve sensor of claim 15, wherein the first AFM film has a higher Mn content than the second AFM film.

17. The spin-valve sensor of claim 15, wherein the first AFM Pt—Mn film has a Mn content in the range of between about 47 and about 53 at %.

18. The spin-valve sensor of claim 15, wherein the first AFM Pt—Mn film has a Mn content of about 52 at %.

19. The spin-valve sensor of claim 15, wherein the second AFM Pt—Mn has a Mn content in the range of between about 44 and about 47 at %.

20. The spin-valve sensor of claim 15, wherein the second AFM Pt—Mn has a Mn content of about 45 at %.

21. The spin-valve sensor of claim 15, wherein the first AFM Pt—Mn film has a thickness in a range between about 25 and about 225 Å.

22. The spin-valve sensor of claim 15, wherein the first AFM Pt—Mn film has a thickness of about 125 Å.

23. The spin-valve sensor of claim 15, wherein the second AFM Pt—Mn film has a thickness in a range between about 25 and about 225 Å.

24. The spin-valve sensor of claim 15, wherein the second AFM Pt—Mn film has a thickness of about 125 Å.

25. The spin-valve sensor of claim 15, wherein the first and second AFM Pt—Mn films have a total thickness in a range between about 200 and about 250 Å.

26. The spin-valve sensor of claim 15, wherein the first and second AFM Pt—Mn films have a total thickness of about 200 Å.

27. A disk drive system, comprising:
    a spin-valve sensor, the spin-valve sensor comprising:
    a sensing layer formed of a first ferromagnetic material
    a reference layer formed of a second ferromagnetic material;
    a spacer layer interposed between the sensing layer and the reference layer, the spacer layer formed of a non-ferromagnetic conducting material; and
    a pinning layer disposed adjacent to one side of the reference layer, the pinning layer having a thickness of at least about 200 Å and comprising at least two antiferromagnetic (AFM) films each having a Mn content in the range of about 40 at % and 60 at %, the films selected from the same binary Ni—Mn or Pt—Mn alloy system;
    an actuator for moving the spin-valve sensor across the magnetic disk so the spin-valve may access different regions of written data on the magnetic disk; and
    a detector coupled to the spin-valve sensor for detecting changes in resistance of the sensor caused by rotation of the magnetization of the sensing layer relative to the fixed magnetization of the reference layer in response to magnetic fields from the written data.

* * * * *